United States Patent
Torii

(10) Patent No.: US 7,986,471 B2
(45) Date of Patent: Jul. 26, 2011

(54) OPTICAL ELEMENT SUPPORTING DEVICE, LENS BARREL, EXPOSURE APPARATUS, AND DEVICE MANUFACTURING METHOD

(75) Inventor: Hirotoshi Torii, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 12/402,155

(22) Filed: Mar. 11, 2009

(65) Prior Publication Data

US 2009/0231735 A1    Sep. 17, 2009

(30) Foreign Application Priority Data

Mar. 12, 2008   (JP) ................................. 2008-062787

(51) Int. Cl.
   *G02B 7/02*   (2006.01)
(52) U.S. Cl. .......................... 359/811; 359/819; 359/822
(58) Field of Classification Search ............... 359/198.1, 359/811, 819, 820, 822, 824; 369/44.15, 369/44.16
See application file for complete search history.

(56) References Cited

U.S. PATENT DOCUMENTS 7,738,193 B2 *   6/2010   Weber et al. ................. 359/811
2002/0176094 A1   11/2002   Petasch et al.

FOREIGN PATENT DOCUMENTS

JP   2002-350699 A   12/2002

* cited by examiner

*Primary Examiner* — Joseph Martinez
(74) *Attorney, Agent, or Firm* — Canon U.S.A., Inc., I.P. Division

(57) ABSTRACT

An optical-element supporting device includes a first supporting unit and a second supporting unit configured to support an optical element. The first and second supporting units are spaced apart. The first and second supporting units support the optical element so as to constrain translational motion of the optical element along each of three axial directions and rotation of the optical element about each of the three axes. Where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes, n+m=6 is satisfied.

18 Claims, 6 Drawing Sheets

OPTICAL ELEMENT SUPPORTING DEVICE, LENS BARREL, EXPOSURE APPARATUS, AND DEVICE MANUFACTURING METHOD

BACKGROUND OF THE INVENTION

1. Field of the Invention

The present invention relates to an optical-element supporting device for supporting an optical element and, more particularly, to an apparatus for coupling a mirror or lens to a lens barrel of an optical projecting system of a semiconductor device.

2. Description of the Related Art

A reduction projection exposure apparatus for projecting a circuit pattern drawn on a reticle onto a wafer or other components using an optical projecting system and transferring the circuit pattern thereto is used in fabricating a microdevice employing photolithography.

A reduction projection exposure apparatus using extreme ultraviolet (EUV) light of approximately 10 nm to 15 nm, which has a shorter wavelength than that of ultraviolet light (hereinafter referred to as "EUV exposure apparatus") is developed to transfer a very fine line no more than 0.1 µm of a circuit pattern with high resolution.

In an EUV exposure apparatus exposing with high resolution, its optical projecting system is required to have considerably high precision. For the shape of a mirror, distortion of only approximately 1 nm or less is allowable. If an optical element, such as a mirror, is distorted, the optical path changes before and after the distortion, rays to focus do not converge at a point, aberration occurs, image blurring and misregistration occurs, which can result in a short circuit of a circuit pattern on the wafer.

Accordingly, it is necessary to constrain six degrees of freedom of the optical element properly in order to prevent the optical element in the optical projecting system from being distorted and to support the optical element while maintaining a natural frequency high in order to avoid the occurrence of image blurring.

One example of a supporting device for supporting an optical element is disclosed in Japanese Patent Laid-Open No. 2002-350699. The optical-element supporting device supports three sites of an external edge of an optical element using a supporting unit including a plurality of leaf springs.

It is necessary for an optical projecting system of an EUV exposure apparatus to arrange a mirror driving device, a position sensor, and a temperature control device in a limited space around mirrors. In addition, optical design constraints lead to a configuration in which the distance between the mirrors is small and a beam passes in close vicinity to the mirrors. Accordingly, with a structure in which a mirror is supported at three sites, as in a known example, a space for arranging a position sensor and other necessary elements adjacent to the mirror is restricted. Because the space for arranging the position and other elements is restricted, a space for a structure supporting them is also restricted. This may result in difficulty in arranging the position sensor and other elements while maintaining sufficient rigidity. Therefore, it is necessary to support the mirror more compactly in order to arrange the position sensor and other elements around the mirror while maintaining a high rigidity (natural frequency).

Moreover, it is also required that six degrees of freedom of the mirror be constrained properly to protect the mirror from being distorted.

SUMMARY OF THE INVENTION

The present invention provides a compact support device capable of constraining six degrees of freedom of an optical element, such as a mirror, properly.

According to a first aspect of the present invention, an optical-element supporting device includes a first supporting unit and a second supporting unit configured to support an optical element. The first supporting unit and the second supporting unit are spaced apart. The first supporting unit and second supporting unit support the optical element so as to constrain translational motion of the optical element along each of three axial directions and rotation of the optical element about each of the three axes. Where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes, $n+m=6$ is satisfied.

According to a second aspect of the present invention, an optical-element supporting device includes a first supporting unit and a second supporting unit configured to support an optical element. The first supporting unit and the second supporting unit are spaced apart. The first supporting unit includes a rigid member and two elastic plates. The elastic plates are arranged in a first axial direction relative to the rigid member. One of the two elastic plates included in the first supporting unit extends along a second axial direction being the direction between the first supporting unit and the second supporting unit, and the other of the two elastic plates extends along a third axial direction perpendicular to the first axial direction and the second axial direction. The second supporting unit includes a rigid member and two elastic plates. The elastic plates are arranged in the first axial direction relative to the rigid member. The two elastic plates included in the second supporting unit extend along the third axial direction.

According to a third aspect of the present invention, an optical-element supporting device includes a first supporting unit and a second supporting unit configured to support an optical element. The first supporting unit and the second supporting unit are spaced apart. The first supporting unit includes a rigid member and an elastic plate. The elastic plate is arranged along a first axial direction relative to the rigid member and extends along a third axial direction perpendicular to the first axial direction and a second axial direction being the direction between the first supporting unit and the second supporting unit. The second supporting unit includes two structures each including a rigid member and two elastic rods arranged in series in the first axial direction such that the rigid member is sandwiched between the two elastic rods. A gap between the two structures becomes smaller along the first axial direction.

According to a fourth aspect of the present invention, an optical-element supporting device includes a first supporting unit and a second supporting unit configured to support an optical element. The first supporting unit and the second supporting unit are spaced apart. The first supporting unit includes a rigid member and an elastic plate. The elastic plate is arranged along a first axial direction relative to the rigid member and extends along a third axial direction perpendicular to the first axial direction and a second axial direction being the direction between the first supporting unit and the second supporting unit. The second supporting unit includes a rigid member, an elastic plate, and an elastic rod. The rigid member, the elastic plate, and the elastic rod are arranged in series in the first axial direction such that the rigid member is sandwiched between the elastic plate and the elastic rod. The elastic plate extends along the third axial direction.

According to a fifth aspect of the present invention, an optical-element supporting device includes a first supporting unit and a second supporting unit configured to support an optical element. The first supporting unit and the second supporting unit are spaced apart. The optical element is elongated in a direction from the first supporting unit toward the second supporting unit. The second supporting unit constrains translational motion of the optical element along each of two directions perpendicular to the direction from the first supporting unit toward the second supporting unit and rotation of the optical element about the direction from the first supporting unit toward the second supporting unit more strongly than the other translational motion and rotation. The first supporting unit constrains translational motion of the optical element along each of three mutually perpendicular directions more strongly than translational motion of the second supporting unit along the direction from the first supporting unit toward the second supporting direction. The first supporting unit supports rotation of the optical element about each of the three mutually perpendicular directions such that the optical element can easily rotate about the direction from the first supporting unit toward the second supporting unit.

According to a sixth aspect of the present invention, an optical-element supporting device includes a first supporting unit and a second supporting unit configured to support an optical element. The first supporting unit and the second supporting unit are spaced apart. The optical element is elongated in a direction from the first supporting unit toward the second supporting unit. The first supporting unit constrains translational motion of the optical element along each of three mutually perpendicular directions and rotation of the optical element about the direction from the first supporting unit toward the second supporting unit more strongly than the other translational motion and rotation. The second supporting unit constrains translational motion of the optical element along each of two directions perpendicular to the direction from the first supporting unit toward the second supporting unit more strongly than the other translational motion and rotation.

Further features of the present invention will become apparent from the following description of exemplary embodiments with reference to the attached drawings.

DESCRIPTION OF THE EMBODIMENTS

Various embodiments of the present invention are described below with reference to the accompanying drawings.

Figure 1:
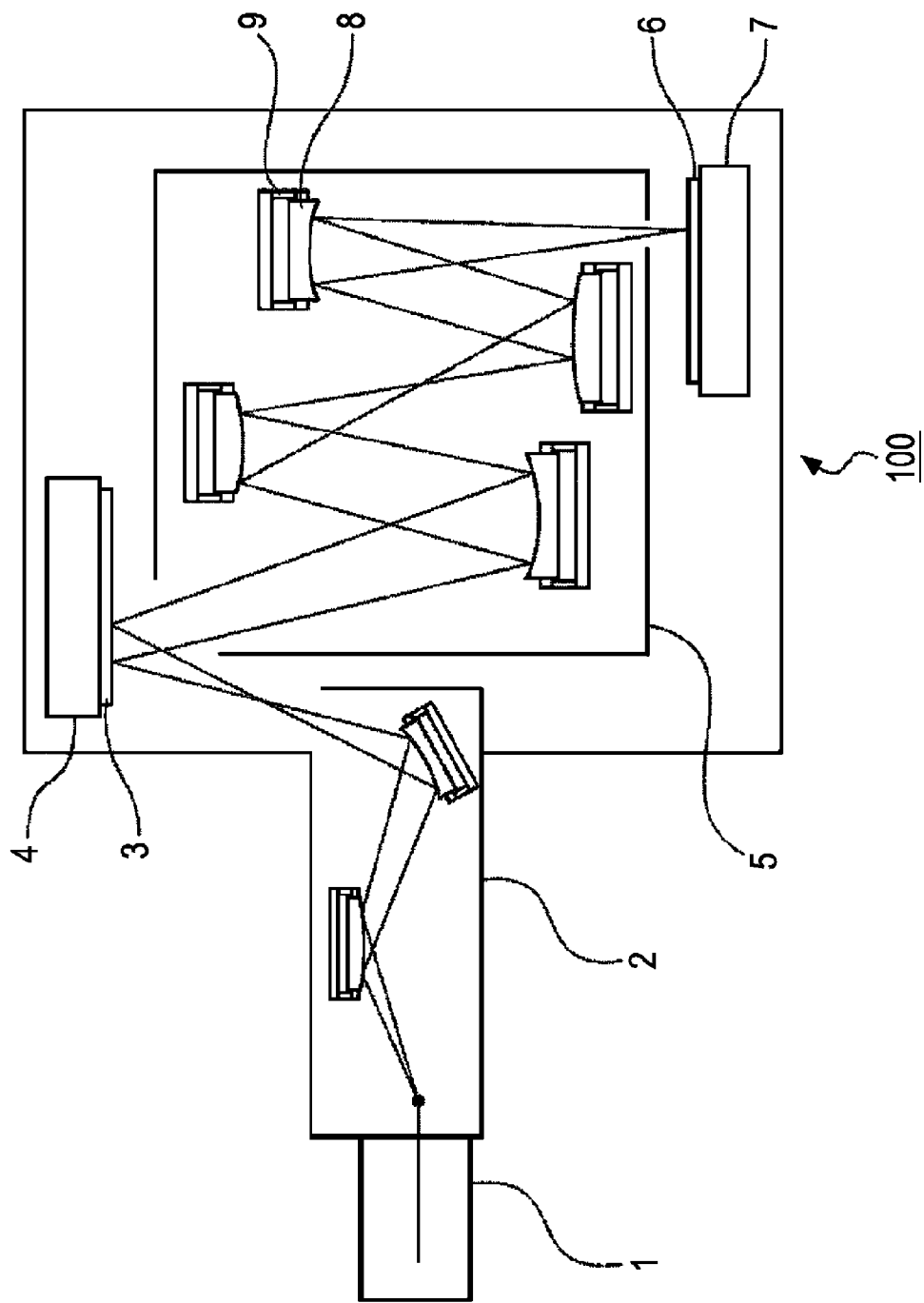
FIG. 1 illustrates a schematic configuration of an exposure apparatus according to a first embodiment of the present invention.

As illustrated in FIG. 1, an exposure apparatus 100 according to a first embodiment of the present invention includes a light source 1, an illumination optical system 2, a reticle stage 4 holding a reticle 3, an optical projecting system 5 (lens barrel), and a wafer stage 7 holding a wafer 6.

The light source 1 is an EUV light source. The illumination optical system 2 includes a plurality of mirrors and a stop. The illumination optical system 2 irradiates the reticle 3 with the EUV light emitted from the light source 1. The reticle 3 is held on the reticle stage 4 and scanned by the reticle stage 4.

The EUV light reflected from the reticle 3 enters the optical projecting system 5. In the optical projecting system 5, a plurality of optical elements 8 is arranged through optical-element supporting devices 9. Here, each of the optical elements 8 is a mirror.

Each of the optical-element supporting devices 9 may be connected to a driving mechanism (not shown) using, for example, a piezoelectric element to adjust the position of the optical element 8. The EUV light entering the optical projecting system 5 is reflected from the plurality of optical elements 8, and reaches the wafer 6 such that a pattern image reduced to, for example, a quarter or a fifth is projected on the wafer 6. FIG. 1, the optical projecting system 5 is composed of four optical elements. Alternatively, six or eight optical elements may be used to perform exposure with a large screen size. The wafer 6 is held on the wafer stage 7. The wafer stage 7 and the reticle stage 4 simultaneously scan at the same velocity ratio as the reduction factor of the projecting system.

In such a way, a pattern image formed on the reticle is projected on the wafer, and the wafer is subjected to exposure.

Figure 2:
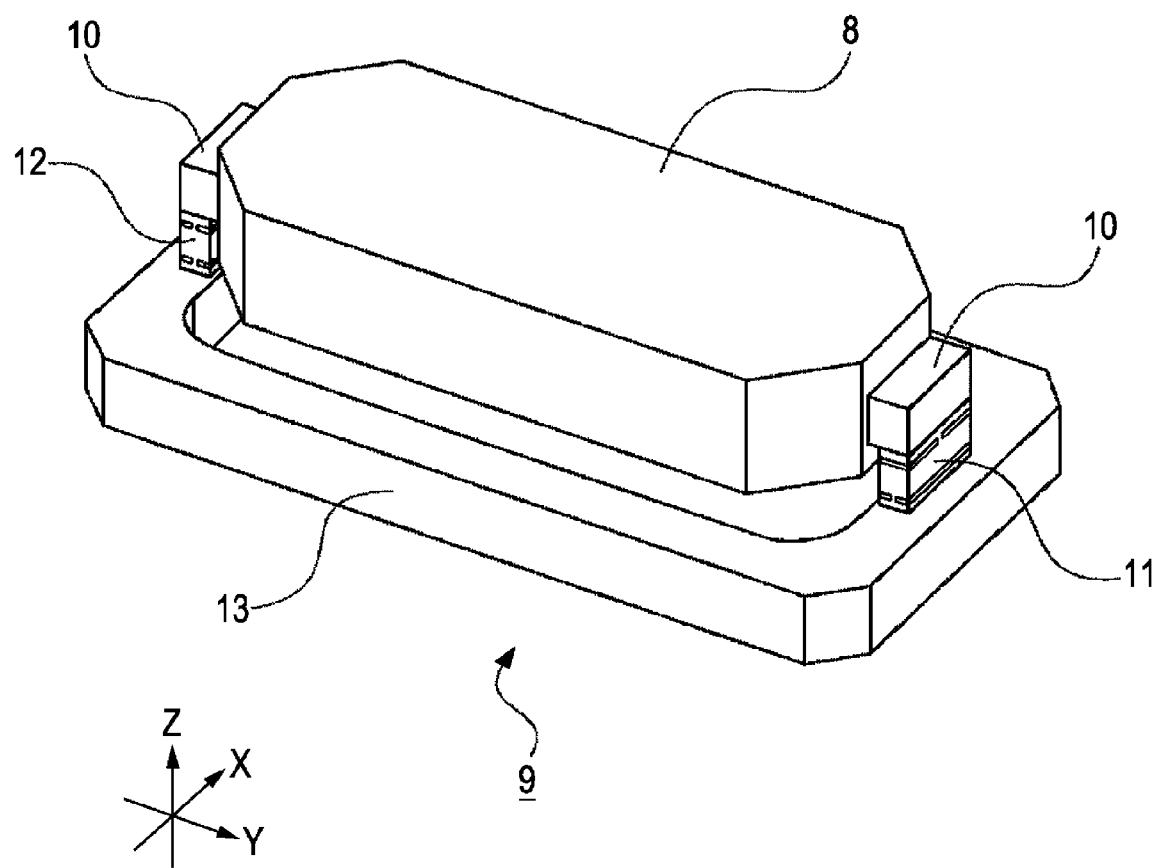
FIG. 2 illustrates an optical-element supporting device according to the first embodiment.

FIG. 2 is a detailed drawing of the optical-element supporting device 9 according to the first embodiment.

The optical element 8 is connected to a supporting unit 11 (first supporting unit) and a supporting unit 12 (second supporting unit) through two connecting members 10. The supporting units 11 and 12 are coupled to a base structure 13. FIG. 2 illustrates an example in which each of the connecting members 10 is made of metal and is directly bonded to the optical element. However, the optical element may have a projection inserted in the metal element, although this configuration is not illustrated. In FIG. 2, the base structure 13 has a polygonal shape. However, the base structure 13 may be circular if needed. The base structure 13 is so hard that the optical element 8 is not distorted by an external force. It is useful that a low thermal expansion material having a thermal expansion coefficient similar to that of the optical element 8 is used in the base structure 13 in consideration of thermal effects.

Figure 3:
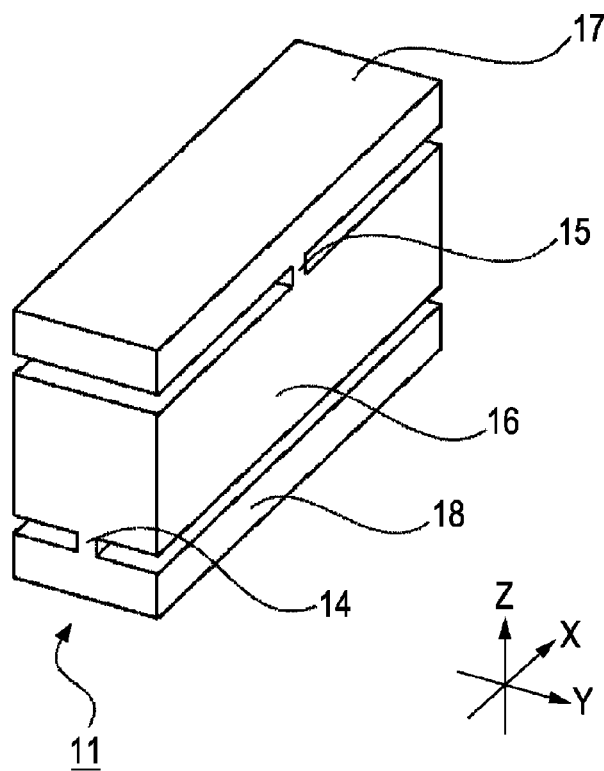
FIG. 3 illustrates a first supporting unit according to the first embodiment.

FIG. 3 illustrates the supporting unit 11 of the first embodiment in detail. The supporting unit 11 includes leaf springs 14 and 15, which are elastic plates, and rigid members 16, 17, and 18.

An axis that extends along the direction in which the leaf spring 14 is arranged relative to the rigid member 16 is the Z axis (first axis). In an arrangement of the supporting units 11 and 12 illustrated in FIG. 2, an axis that extends along the direction in which the supporting units 11 and 12 are connected to each other is the y axis (second axis). An axis perpendicular to both the z axis and y axis is the x axis (third axis).

The leaf spring 14 is arranged along the z-axis direction (−z direction in FIG. 3), which is the first axial direction, relative to the rigid member 16, and the rigid member 16 and the rigid member 18 are connected to each other using the leaf spring 14. Because the leaf spring 14 extends along the x-axis direction, which is the third axial direction, the rigid member 16 can easily alter its orientation about the x axis (about the third axis) relative to the rigid member 18. The leaf spring 15 is arranged along the z-axis direction (+z direction in FIG. 3) relative to the rigid member 16, and the rigid member 16 and the rigid member 17 are connected to each other using the leaf spring 15. Because the leaf spring 15 extends along the y-axis direction, which is the second axial direction, the rigid member 17 can easily alter its orientation about the y axis (about the second axis) relative to the rigid member 16.

The rigid member 17 is arranged between the connecting member 10 and the leaf spring 15 and connects both of them. However, the leaf spring 15 may be directly connected to the connecting member 10 without the provision of the rigid member 17.

The rigid member 18 is arranged between the base structure 13 and the leaf spring 14 and connects both of them. However, the leaf spring 14 may be directly connected to the base structure 13 without the provision of the rigid member 18.

The three axes of translational motion of the optical element 8 along each of the x-axis, y-axis, and z-axis directions are constrained by the supporting unit 11. The rotation about each of the above three axes are not constrained because the optical element 8 can be easily rotated thereabout. Accordingly, among the six axes of translational motion along each of the x-axis, y-axis, and z-axis directions and rotation about each of the x axis, y axis, and z axis, the number of axes of the optical element 8 constrained by the supporting unit 11 is three. Here, "constrained" indicates a state that has a sufficiently high rigidity with respect to an "unconstrained" direction and that does not easily move or rotate. In the drawing, the leaf spring 14 is adjacent to the base structure 13, and the leaf spring 15 is adjacent to the connecting member 10. However, even if the leaf spring 14 and the leaf spring 15 are interchanged, similar advantages are obtainable.

Figure 4:
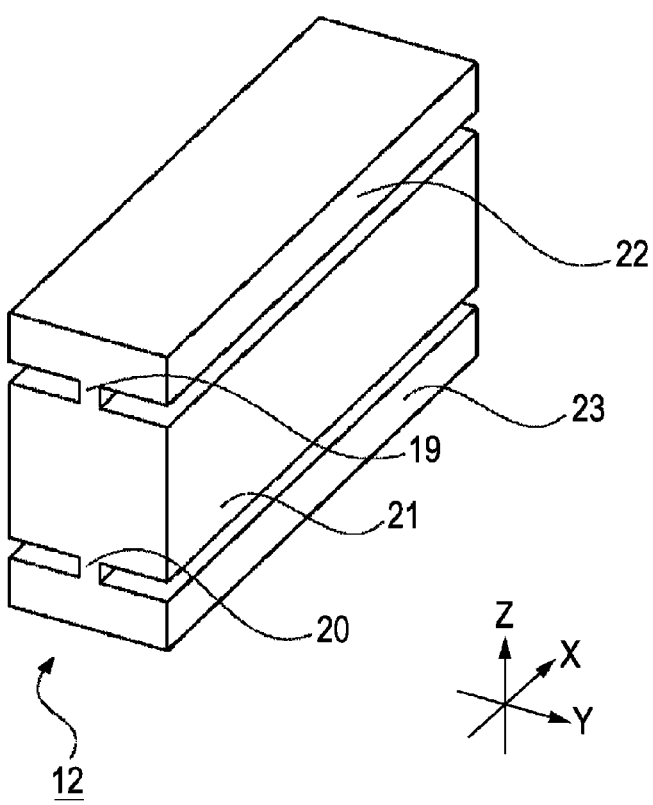
FIG. 4 illustrates a second supporting unit according to the first embodiment.

FIG. 4 illustrates the supporting unit 12 of the first embodiment in detail. The supporting unit 12 includes leaf springs 19 and 20, which are elastic plates, and rigid members 21, 22, and 23.

The leaf spring 19 is arranged along the z-axis direction (+z direction in FIG. 4) relative to the rigid member 21, and the rigid member 21 and the rigid member 22 are connected to each other using the leaf spring 19. Because the leaf spring 19 extends along the x-axis direction, the rigid member 22 can easily alter its orientation about the x axis relative to the rigid member 21.

The leaf spring 20 is arranged along the z-axis direction (−z direction in FIG. 4) relative to the rigid member 21, and the rigid member 23 and the rigid member 21 are connected to each other using the leaf spring 20. Because the leaf spring 20 extends along the x-axis direction, the rigid member 21 can easily alter its orientation about the x axis relative to the rigid member 23.

In such a way, the leaf springs 19 and 20 extending along the x-axis direction are arranged in the z-axis direction in series, thereby allowing the rigid member 22 to be translated in the y-axis direction relative to the rigid member 23.

The rigid member 22 is arranged between the connecting member 10 and the leaf spring 19 and connects both of them. However, the leaf spring 19 may be directly connected to the connecting member 10 without the provision of the rigid member 22.

The rigid member 23 is arranged between the base structure 13 and the leaf spring 20 and connects both of them. However, the leaf spring 20 may alternatively be directly connected to the base structure 13 without the provision of the rigid member 23.

The three axes of translational motion of the optical element 8 along each of the x-axis and z-axis directions and rotation about the y-axis direction are constrained by the supporting unit 12. The translational motion in the y-axis direction and rotation about each of the z-axis and x-axis directions are not constrained. Accordingly, among the six axes of translational motion along each of the x-axis, y-axis, and z-axis directions and rotation about each of the x axis, y axis, and z axis, the number of axes of the optical element 8 constrained by the supporting unit 12 is three.

The translational motion of the optical element along each of the three axes of the x-axis, y-axis, and z-axis directions are constrained by the supporting unit 11. The translational motion of the optical element along each of the x-axis and z-axis directions and rotation about the y-axis direction are constrained by the supporting unit 12. The rotation of the optical element about each of the x-axis and z-axis directions is constrained by the supporting units 11 and 12. Accordingly, the translational motion of the optical element 8 in the three axial directions of the x-axis, y-axis, and z-axis directions and rotation about each of the three axes can be constrained by the two supporting units 11 and 12.

In such a way, the six axes of an optical element, such as a mirror and a lens, can be constrained by the two spaced apart supporting units 11 and 12 properly.

Examples of the material of the supporting units 11 and 12 include a low thermal expansion alloy (e.g., Invar alloy) and precipitation hardening stainless steel.

Each of the supporting units 11 and 12 may be made up of integrally formed elastic plates and rigid members, or alternatively, of separately prepared elastic plates and rigid members coupled together by manufacturing methods, such as pressure bonding, welding, screwing, and press-fitting.

As illustrated in FIG. 2, it is useful that the optical element supported by the supporting units 11 and 12 has a cross-sectional shape in the xy plane that is longer in the x-axis direction that in the y-axis direction.

The advantages obtainable with an optical element having such a shape are described below. Typically, an optical element is supported through a frame holding the optical element, not directly supported by a supporting unit. With a known configuration in which an optical element is supported at three sites, when the optical element has an elongated shape, it is necessary to extend the frame in the y-axis direction in order to dispose the third supporting unit. In contrast, with the optical-element supporting device according to the first embodiment of the present invention, the optical element is supported by the two supporting units, thus eliminating the necessity to extend the frame to dispose the third supporting unit. Accordingly, a saved space can be available.

Figure 5:
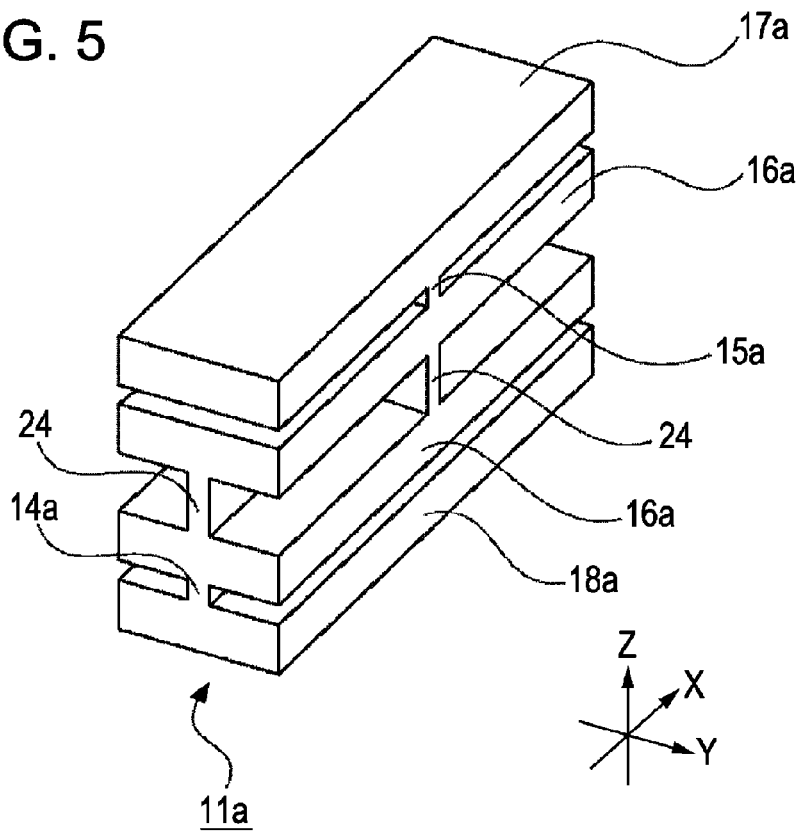
FIG. 5 illustrates a first supporting unit according to a modification example.

FIG. 5 illustrates a modification example 11a of the supporting unit 11. The parts corresponding to those described in FIG. 3 are represented by the same numerals as in FIG. 3 with the letter "a" being attached. In this example, a cross-shaped elastic plate 24 is disposed between two rigid members 16a. Thus, the shape can be altered about the z axis (about the first axis) more easily.

Figure 6:
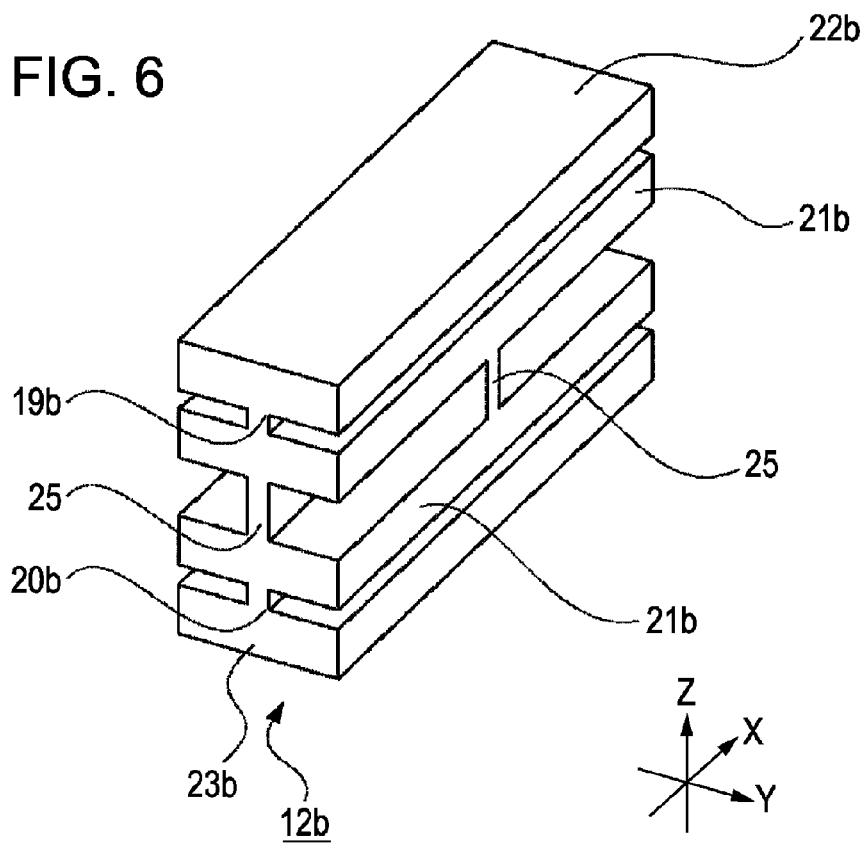
FIG. 6 illustrates a second supporting unit according to the modification example.

FIG. 6 illustrates a modification example 12b of the supporting unit 12. The parts corresponding to those described in FIG. 4 are represented by the same numerals as in FIG. 4 with the letter "b" being attached. In this example, a cross-shaped elastic plate 25 is disposed between two rigid members 21b. Thus, the shape can be altered about the z axis more easily.

Such a cross-shaped elastic plate may be disposed on either one of the supporting units 11 and 12 or both. The provision of the cross-shaped elastic plate enables a reduction in constraint occurring in a direction other than the six axes.

Figure 7:
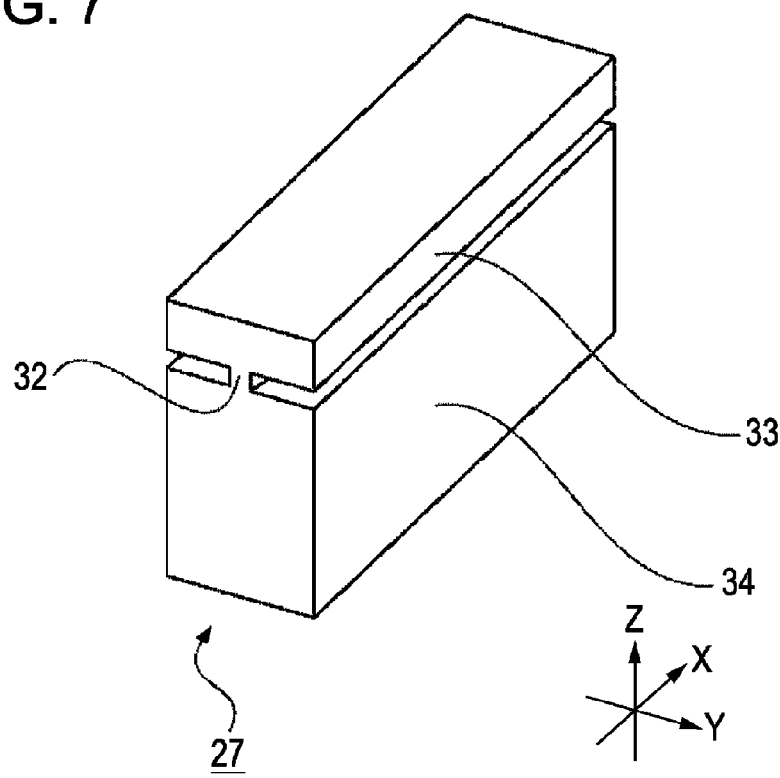
FIG. 7 illustrates a first supporting unit according to a second embodiment of the present invention.

A supporting unit 27 according to a second embodiment of the present invention illustrated in FIG. 7 includes a leaf spring 32, which is an elastic plate, and rigid members 33 and 34. The leaf spring 32 is arranged along the z-axis direction relative to the rigid member 34, and the rigid member 33 and the rigid member 34 are connected to each other using the leaf spring 32. Because the leaf spring 32 extends along the x-axis direction, the rigid member 33 can easily alter its orientation about the x axis relative to the rigid member 34.

The rigid member 33 is arranged between the connecting member 10 and the leaf spring 32 and connects both of them. However, the leaf spring 32 may be directly connected to the connecting member 10 without the provision of the rigid member 33.

The rigid member 34 is arranged between the base structure 13 and the leaf spring 32 and connects both of them. However, the leaf spring 32 may be directly connected to the base structure 13 without the provision of the rigid member 34.

The four axes of translational motion of the optical element 8 along each of the x-axis, y-axis, and z-axis directions and rotation about the y axis are constrained by the supporting unit 27. The rotation about each of the x axis and y axis are not constrained. Accordingly, among the six axes of translational motion along each of the x-axis, y-axis, and z-axis directions and rotation about each of the x axis, y axis, and z axis, the number of axes of the optical element 8 constrained by the supporting unit 27 is four.

Figure 8:
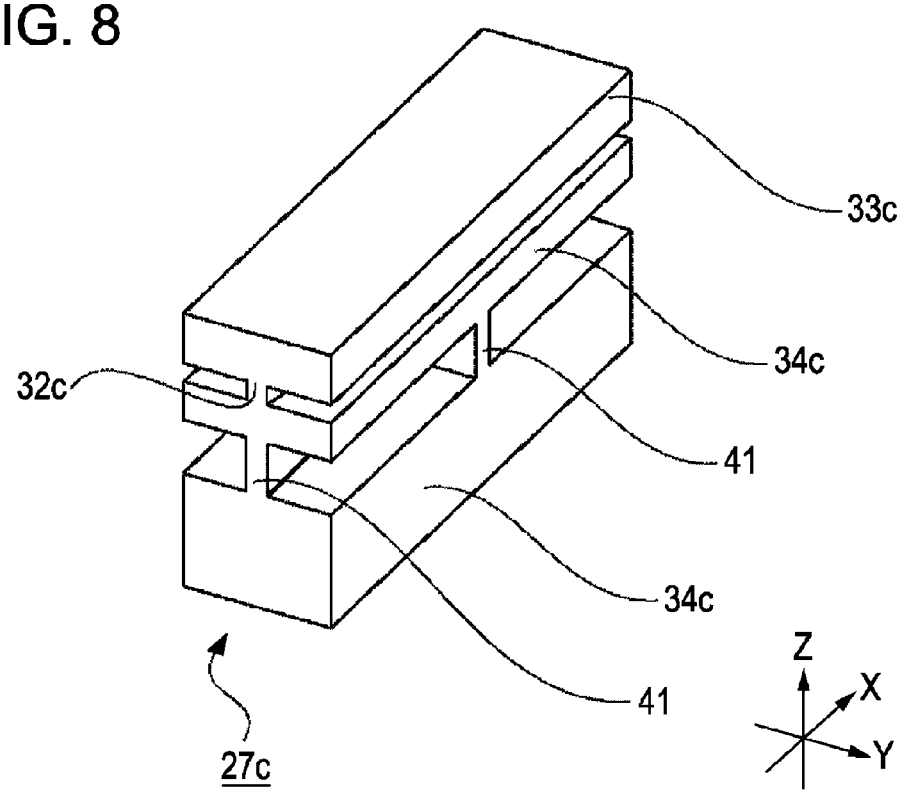
FIG. 8 illustrates a modification example of the first supporting unit according to the second embodiment.

A supporting unit 27c illustrated in FIG. 8 is a modification example of the supporting unit 27. The parts corresponding to those described in FIG. 7 are represented by the same numerals as in FIG. 7 with the letter "c" being attached. In this example, a cross-shaped leaf-spring elastic member 41 is disposed between two rigid members 34c. Thus, the shape can be altered about the z axis more easily.

Figure 9:
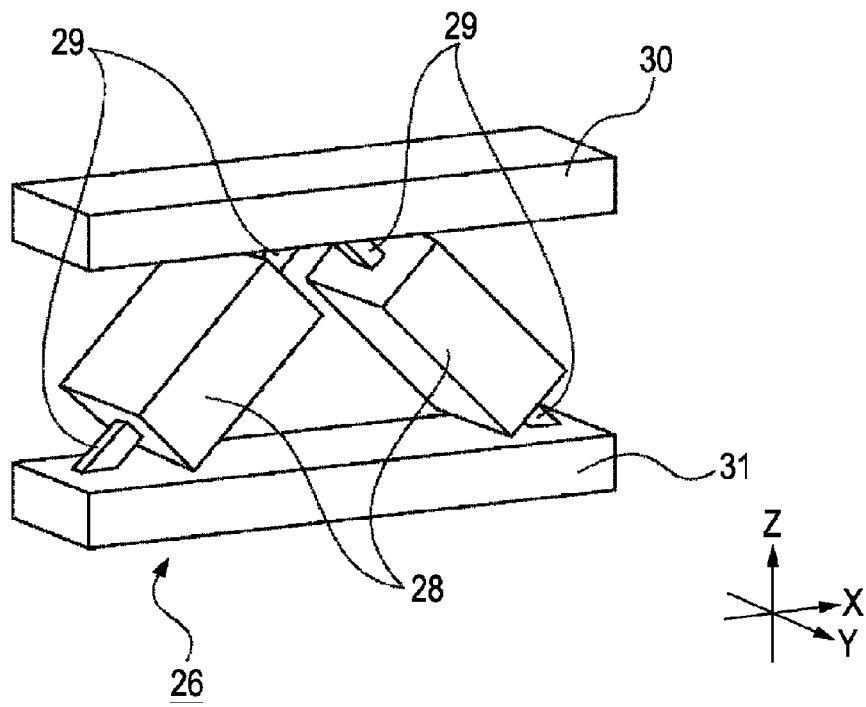
FIG. 9 illustrates a second supporting unit according to the second embodiment.

A supporting unit 26 illustrated in FIG. 9 indicates a general support shape called bipod. The supporting unit 26 includes two structures each having two elastic rods 29 and a rigid member 28 arranged in series such that the rigid member 28 is sandwiched between the elastic rods 29. A first end of each of the two structures is connected to a rigid member 30, and a second end thereof is connected to a rigid member 31. The gap between the two structures becomes smaller along the z-axis direction. That is, the gap between the two elastic rods connected to the rigid member 30 is smaller than the gap between the two elastic rods connected to the rigid member 31.

The two axes of translational motion of the optical element 8 along each of the x-axis and z-axis directions are constrained by the supporting unit 26, whereas the other four axes of translational motion along the y-axis direction and rotation about each of the x-axis, y-axis, and z-axis directions are not constrained. Accordingly, among the six axes of translational motion along each of the x-axis, y-axis, and z-axis directions and rotation about each of the x axis, y axis, and z axis, the number of axes of the optical element 8 constrained by the supporting unit 26 is two.

Supporting the optical element 8 using the supporting units 26 and 27 enables the three axes of translational motion along each of the x-axis, y-axis, and z-axis directions and the three axes of rotation about each of the axial directions to be constrained. That is, the six axes of an optical element can be constrained by the two supporting units 26 and 27 properly.

Figure 10:
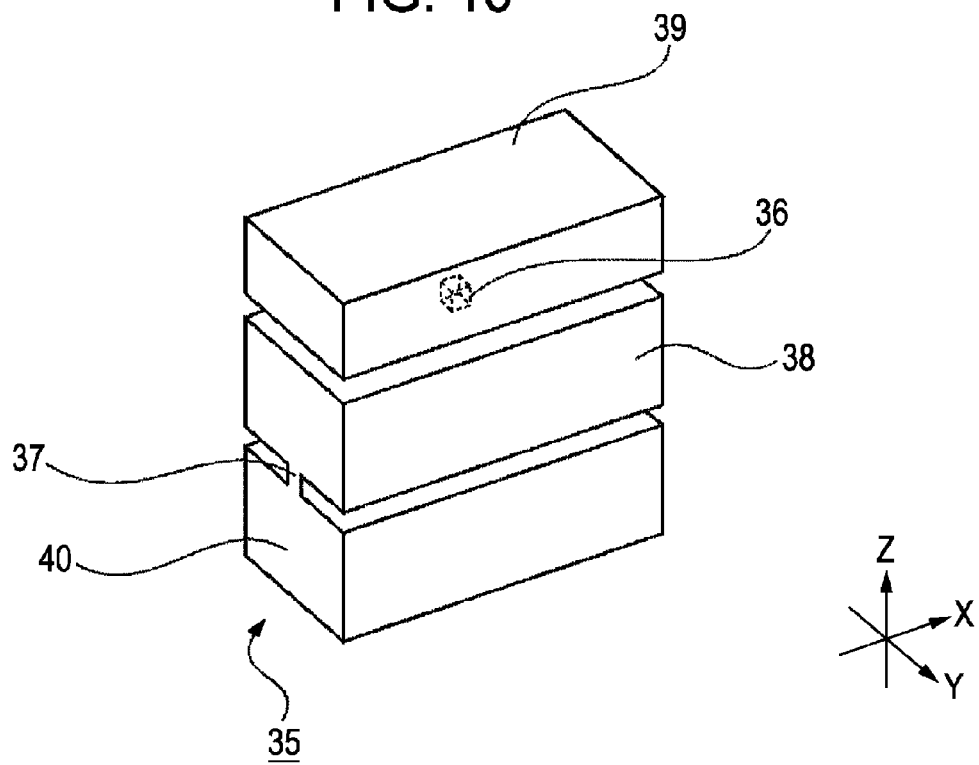
FIG. 10 illustrates a supporting unit according to a third embodiment of the present invention.

A supporting unit 35 according to a third embodiment of the present invention illustrated in FIG. 10 includes an elastic rod 36, a leaf spring 37, which is an elastic plate, and rigid members 38, 39, and 40. The elastic rod 36 is arranged along the z-axis direction (+z direction in FIG. 9) relative to the rigid member 38, and the rigid member 38 and the rigid member 39 are connected to each other using the elastic rod 36. This enables the rigid member 39 to be rotated about each of the x-axis, y-axis, and z-axis directions relative to the elastic rod 36. The leaf spring 37 is arranged along the z-axis direction (−z direction in FIG. 9) relative to the rigid member 38, and the rigid member 38 and the rigid member 40 are connected to each other using the leaf spring 37. Because the elastic plate extends along the x-axis direction, the rigid member 38 can easily alter its orientation about the x axis relative to the rigid member 40.

The rigid member 39 is arranged between the connecting member 10 and the rigid member 36 and connects both of them. However, the leaf spring 37 may be directly connected to the connecting member 10 without the provision of the rigid member 39. The rigid member 40 is arranged between the base structure 13 and the leaf spring 37 and connects both of them. However, the leaf spring 37 may be directly connected to the base structure 13 without the provision of the rigid member 40.

The two axes of translational motion of the optical element 8 along each of the x-axis and z-axis directions are constrained by the supporting unit 35, whereas the other axes of translational motion along the y-axis direction and rotation about each of the x-axis, y-axis, and z-axis directions are not constrained. Accordingly, among the six axes of translational motion along each of the x-axis, y-axis, and z-axis directions and rotation about each of the x axis, y axis, and z axis, the number of axes of the optical element 8 constrained by the supporting unit 35 is two. The use of the supporting unit 35 in combination with the supporting unit 27 used in constraining the four axes of the optical element 8 to support the optical element 8 enables the six axes of the optical element to be constrained properly using the two supporting units 35 and 27.

A device (e.g., semiconductor integrated circuit element, liquid crystal display element) can be manufactured according to another embodiment of the present invention using an exposure apparatus described in any one of the above embodiments through a step of exposing a substrate (e.g., wafer, glass substrate) on which a photoresist is applied. A conventional step of developing the substrate, and other conventional steps are also applied to manufacture the device.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-062787 filed Mar. 12, 2008, which is hereby incorporated by reference herein in its entirety.

What is claimed is:

1. An optical-element supporting device comprising:
   a first supporting unit and a second supporting unit configured to support an optical element, wherein the first supporting unit and the second supporting unit are spaced apart, the first supporting unit and second supporting unit support the optical element so as to constrain translational motion of the optical element along each of three axial directions and rotation of the optical element about each of the three axes, and the following expression is satisfied:

$$n+m=6$$

where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes.

2. The optical-element supporting device according to claim 1, wherein each of the first supporting unit and the second supporting unit includes a rigid member and at least one elastic plate, and n and m are three.

3. The optical-element supporting device according to claim 2, wherein the number of the elastic plates included in at least one of the first supporting unit and the second supporting unit is one or two.

4. The optical-element supporting device according to claim 2, wherein the elastic plate is arranged along a first axial direction relative to the rigid member, the first supporting unit constrains translational motion of the optical element along each of the first axial direction, a second axial direction being the direction between the first supporting unit and the second supporting unit, and a third axial direction being perpendicular to the first axial direction and the second axial direction among the translational motion of the optical element along each of the three axial directions and rotation of the optical element about each of the three axes, and the second supporting unit constrains the translational motion of the optical element along each of the first axial direction and the third axial direction and the rotation of the optical element about the second axis among the translational motion of the optical element along each of the three axial directions and rotation of the optical element about each of the three axes.

5. The optical-element supporting device according to claim 4, wherein either one or both of the first supporting unit and the second supporting unit include an elastic plate extending along the second axial direction and an elastic plate extending along the third axial direction, the elastic plates being perpendicular to each other.

6. The optical-element supporting device according to claim 4, wherein the optical element has a cross-sectional shape being longer in the second axial direction than in the third axial direction in a plane perpendicular to the first axial direction.

7. The optical-element supporting device according to claim 1, wherein the first supporting unit includes a rigid member and an elastic plate, the second supporting unit includes a rigid member and an elastic rod, and n is four and m is two.

8. The optical-element supporting device according to claim 3, wherein the elastic plate is arranged in a first axial direction relative to the rigid member, the first supporting unit constrains translational motion of the optical element along each of the first axial direction, a second axial direction being the direction between the first supporting unit and the second supporting unit, and a third axial direction being perpendicular to the first axial direction and the second axial direction and rotation of the optical element about the second axis among the translational motion of the optical element along each of the three axial directions and the rotation of the optical element about each of the three axes, and the second supporting unit constrains the translational motion of the optical element along each of the first axial direction and the second axial direction among the translational motion of the optical element along each of the three axial directions and rotation of the optical element about each of the three axes.

9. The optical-element supporting device according to claim 1, wherein the first supporting unit includes a rigid member and an elastic plate, the second supporting unit includes a rigid member, an elastic plate, and an elastic rod, and n is four and m is two.

10. The optical-element supporting device according to claim 1, wherein the optical element is one of a mirror and a lens.

11. An optical-element supporting device comprising:

a first supporting unit and a second supporting unit configured to support an optical element, wherein the first supporting unit and the second supporting unit are spaced apart, the first supporting unit includes a rigid member and two elastic plates, the elastic plates are arranged in a first axial direction relative to the rigid member, one of the two elastic plates included in the first supporting unit extends along a second axial direction being the direction between the first supporting unit and the second supporting unit, and the other of the two elastic plates extends along a third axial direction perpendicular to the first axial direction and the second axial direction, the second supporting unit includes a rigid member and two elastic plates, the elastic plates are arranged in the first axial direction relative to the rigid member, and the two elastic plates included in the second supporting unit extend along the third axial direction.

12. An optical-element supporting device comprising:

a first supporting unit and a second supporting unit configured to support an optical element, wherein the first supporting unit and the second supporting unit are spaced apart, the first supporting unit includes a rigid member and an elastic plate, the elastic plate is arranged along a first axial direction relative to the rigid member and extends along a third axial direction perpendicular to the first axial direction and a second axial direction being the direction between the first supporting unit and the second supporting unit, the second supporting unit includes two structures each including a rigid member and two elastic rods arranged in series in the first axial direction such that the rigid member is sandwiched between the two elastic rods, and a gap between the two structures becomes smaller along the first axial direction.

13. An optical-element supporting device comprising:

a first supporting unit and a second supporting unit configured to support an optical element, wherein the first supporting unit and the second supporting unit are spaced apart, the first supporting unit includes a rigid member and an elastic plate, the elastic plate is arranged along a first axial direction relative to the rigid member and extends along a third axial direction perpendicular to the first axial direction and a second axial direction being the direction between the first supporting unit and the second supporting unit, the second supporting unit includes a rigid member, an elastic plate, and an elastic rod, the rigid member, the elastic plate, and the elastic rod are arranged in series in the first axial direction such that the rigid member is sandwiched between the elastic plate and the elastic rod, and the elastic plate extends along the third axial direction.

14. An optical-element supporting device comprising:

a first supporting unit and a second supporting unit configured to support an optical element, wherein the first supporting unit and the second supporting unit are spaced apart, the optical element is elongated in a direction from the first supporting unit toward the second supporting unit, the second supporting unit constrains translational motion of the optical element along each of two directions perpendicular to the direction from the first supporting unit toward the second supporting unit and rotation of the optical element about the direction from the first supporting unit toward the second supporting unit more strongly than the other translational motion and rotation, the first supporting unit constrains translational motion of the optical element along each of three mutually perpendicular directions more strongly than translational motion of the second supporting unit along the direction from the first supporting unit toward the second supporting direction, and the first supporting unit supports rotation of the optical element about each of the three mutually perpendicular directions such that the optical element can easily rotate about the direction from the first supporting unit toward the second supporting unit.

15. An optical-element supporting device comprising:

a first supporting unit and a second supporting unit configured to support an optical element, wherein the first supporting unit and the second supporting unit are spaced apart, the optical element is elongated in a direction from the first supporting unit toward the second supporting unit, the first supporting unit constrains translational motion of the optical element along each of three mutually perpendicular directions and rotation of the optical element about the direction from the first supporting unit toward the second supporting unit more strongly than the other translational motion and rotation, and the second supporting unit constrains translational motion of the optical element along each of two directions perpendicular to the direction from the first supporting unit toward the second supporting unit more strongly than the other translational motion and rotation.

16. A lens barrel holding a plurality of optical elements, wherein each of the plurality of optical elements held by the lens barrel is supported by an optical-element supporting device including:

a first supporting unit and a second supporting unit configured to support an optical element, wherein the first supporting unit and the second supporting unit are spaced apart, the first supporting unit and second supporting unit support the optical element so as to constrain translational motion of the optical element along each of three axial directions and rotation of the optical element about each of the three axes, and the following expression is satisfied:

$$n+m=6$$

where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes.

17. An exposure apparatus transferring a pattern image formed on a reticle onto a wafer through an optical projecting system, wherein the optical projecting system includes a lens barrel holding a plurality of optical elements, each of the plurality of optical elements is supported by an optical-element supporting device including:

a first supporting unit and a second supporting unit configured to support an optical element, wherein the first supporting unit and the second supporting unit are spaced apart, the first supporting unit and second supporting unit support the optical element so as to constrain translational motion of the optical element along each of three axial directions and rotation of the optical element about each of the three axes, and the following expression is satisfied:

$$n+m=6$$

where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes.

18. A device manufacturing method comprising:

exposing a wafer using an exposure apparatus; and developing the wafer, wherein the exposure apparatus includes an optical projecting system transferring a pattern image formed on a reticle onto a wafer, the optical projecting system includes a lens barrel holding a plurality of optical elements, each of the plurality of optical elements is supported by an optical-element supporting device including:

a first supporting unit and a second supporting unit configured to support an optical element, wherein the first supporting unit and the second supporting unit are spaced apart, the first supporting unit and second supporting unit support the optical element so as to constrain translational motion of the optical element along each of three axial directions and rotation of the optical element about each of the three axes, and the following expression is satisfied:

$$n+m=6$$

where n is the number of axes constrained by the first supporting unit among the translational motion of the optical element along each of the three axial directions and the rotation of the optical element about each of the three axes, and m is the number of axes constrained by the second supporting unit among the translational motion of the optical element along each of the three axial directions and the rotation of the optical element about each of the three axes.

* * * * *